United States Patent
Jung

(10) Patent No.: US 7,575,494 B2
(45) Date of Patent: Aug. 18, 2009

(54) FABRICATING METHOD FOR ORGANIC ELECTRO LUMINESCENCE DISPLAY DEVICE HAVING A RIB BARRIER OF REVERSE TAPER SHAPE AND ORGANIC ELECTRO LUMINESCENCE DISPLAY DEVICE

(75) Inventor: Young Sup Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/502,469

(22) Filed: Aug. 11, 2006

(65) Prior Publication Data

US 2007/0152570 A1 Jul. 5, 2007

(30) Foreign Application Priority Data

Dec. 29, 2005 (KR) .................. 10-2005-0133559

(51) Int. Cl.
H01L 51/00 (2006.01)
H01L 29/04 (2006.01)
H01J 9/00 (2006.01)
H01L 21/84 (2006.01)

(52) U.S. Cl. ..................... 445/24; 445/25; 257/59; 313/504; 313/500; 313/506

(58) Field of Classification Search .......... 313/501–507
See application file for complete search history.

(56) References Cited

U.S. PATENT DOCUMENTS

| 5,362,658 | A * | 11/1994 | Kuragaki .................. 438/320 |
| 5,714,917 | A * | 2/1998 | Ella .......................... 332/144 |
| 6,290,563 | B1 * | 9/2001 | Codama et al. ............. 445/24 |
| 2003/0180581 | A1 * | 9/2003 | Petrella et al. ............. 428/702 |
| 2004/0217704 | A1 * | 11/2004 | Iwase et al. ................. 313/518 |
| 2005/0242717 | A1 * | 11/2005 | Bae et al. .................... 313/504 |
| 2005/0242745 | A1 * | 11/2005 | Jung ......................... 315/169.3 |
| 2007/0102737 | A1 * | 5/2007 | Kashiwabara et al. ....... 257/291 |
| 2007/0290196 | A1 * | 12/2007 | Fischer et al. ............... 257/40 |

FOREIGN PATENT DOCUMENTS

| JP | 2000-195677 | 7/2000 |
| JP | 2001-35663 | 2/2001 |
| JP | 2001-351779 | 12/2001 |
| JP | 2005-322655 | 11/2005 |
| JP | 2005-353600 | 12/2005 |

* cited by examiner

Primary Examiner—Sikha Roy
Assistant Examiner—Tracie Y Green
(74) Attorney, Agent, or Firm—McKenna Long & Aldridge

(57) ABSTRACT

This invention relates to a fabricating method of an organic electro luminescence display device that is adaptive for simplifying a process by forming a barrier rib by use of a new material, and an organic electro luminescence display device using the same.

A fabricating method of an organic electro luminescence display device according to an embodiment of the present invention includes: forming an anode electrode on an upper substrate; depositing ZnO on the entire surface of the upper substrate and forming a ZnO film by making the deposited ZnO grow crystals; forming a barrier rib with a reverse taper shape that divides an area where the organic light emitting layer is to be formed on the upper substrate by patterning the ZnO film; forming an organic light emitting layer in the cell area that is divided by the barrier rib; and forming a cathode electrode on the organic light emitting layer.

12 Claims, 13 Drawing Sheets

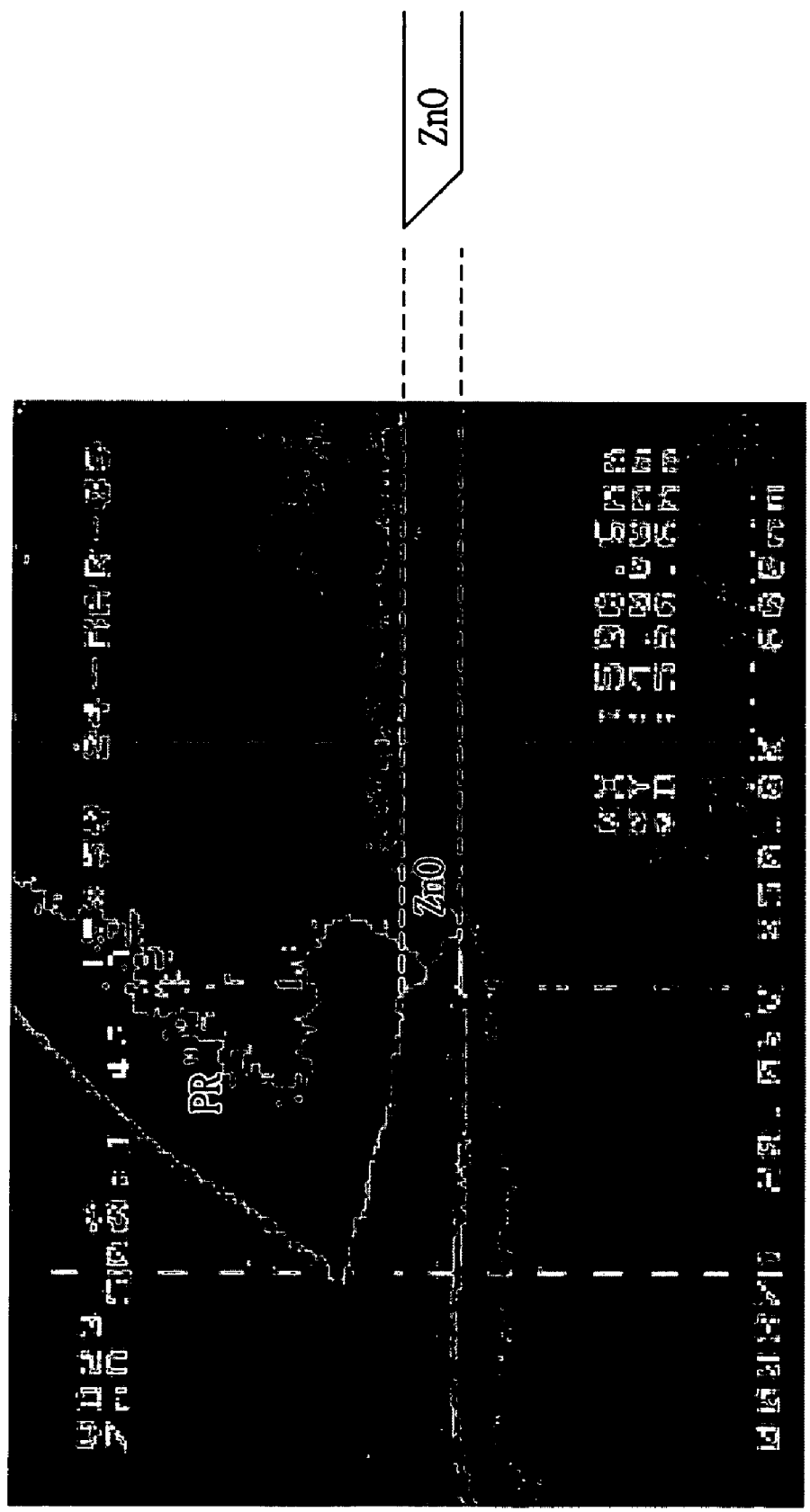

FABRICATING METHOD FOR ORGANIC ELECTRO LUMINESCENCE DISPLAY DEVICE HAVING A RIB BARRIER OF REVERSE TAPER SHAPE AND ORGANIC ELECTRO LUMINESCENCE DISPLAY DEVICE

This application claims the benefit of Korean Patent Application No. 2005-0133559, filed on Dec. 29, 2005, which is hereby incorporated by reference for all purposes as if fully set forth herein.

BACKGROUND OF THE INVENTION

1. Field of the Invention

The present invention relates to a fabricating method of an organic electro luminescence display device and an organic electro luminescence display device using the same, and more particularly to a fabricating method of an organic electro luminescence display device that simplifies its manufacturing process by forming a barrier rib by use of a new material, and an organic electro luminescence display device using the same.

2. Discussion of the Related Art

Recently, various flat panel display devices have been developed that have reduced weight and bulk to overcome the disadvantages of a cathode ray tube (CRT). Such flat panel display devices include a liquid crystal display (LCD), a field emission display (FED), a plasma display panel (hereinafter, referred to as 'PDP') and an organic electro luminescence (hereinafter, referred to as 'EL') display, etc.

Among them the PDP is simple in structure and fabrication process, thus the PDP is drawing attention as the most advantageous display device to be made in large sizes while being light and thin but there is a disadvantage in that its light emission efficiency and brightness are low and its power consumption is high. In comparison to this, an active matrix LCD having a thin film transistor (hereinafter, referred to as 'TFT') as a switching device uses a semiconductor process, thus it is difficult to make large LCDs due to manufacturing yield problems, and its power consumption is high due to a backlight unit. Further, the LCD has a disadvantage in that its viewing angle is narrow and there is a high light loss by optical devices such as a polarizing filter, a prism sheet, a diffusion plate, etc.

In comparison to this, the EL display device is generally divided into an inorganic EL display device and an organic EL display device in accordance with the type of material in a light emitting layer. The EL display is a self luminous device and has an advantage in that its response speed is fast, its light emission efficiency and brightness are high and its viewing angle is wide. An inorganic EL display device has higher power consumption than an organic EL display device, and the inorganic EL display device does not have high brightness and does not emit light with various colors of R (red), G (green) and B (blue). On the contrary, the organic EL display device is driven at a low DC voltage of several tens of volts, and the organic EL display device has a rapid response speed, has high brightness and can emit light with various colors of R, G, B, thus it is suitable for the next generation flat panel display device.

The organic EL display device includes sub-pixels arranged in an area defined by the crossing of gate lines and the data lines. The sub-pixel receives a data signal from the data line when a gate pulse is supplied to the gate line, and the sub-pixel emits light corresponding to the data signal, thereby displaying a picture.

The organic EL display device includes: an upper array substrate where an EL cell is formed; a lower array substrate where a drive TFT for driving the EL cell is formed; and a spacer that connects a cathode electrode of the EL cell to a drain electrode of the drive TFT.

Currently, the EL cell is formed to be separated by barrier ribs, and the barrier rib is formed in a reverse taper shape in order to divide the EL cell. The barrier ribs of the reverse taper shape effectively divide an organic light emitting layer of the EL cell and further make the cathode electrode separated by only the deposition of an electrode material without patterning. Accordingly, its yield is improved because the organic EL display device effectively separates the organic light emitting layer by the barrier ribs with the reverse taper shape, and its manufacturing cost is reduced because the cathode electrode is formed without being patterned.

Hereinafter, in reference to FIGS. 1A to 1C, a detailed description will be made for a method of forming the barrier ribs with the reverse taper shape of the organic EL display device as follows.

Referring to FIG. 1A, according to a fabricating method of a barrier rib 8 with a reverse taper shape in an organic EL display device of the related art, a silicon nitride SiN×1 8a is deposited on the entire surface of an upper substrate 2, where a bus electrode 5, an anode electrode 4 and an insulating film 6 are formed, at a temperature of not greater than 280° C.

Subsequently, a silicon nitride SiN×2 8b is deposited on the entire surface of the silicon nitride SiN×1 8a that is deposited on the entire surface at a temperature of not greater than 280° C., at a temperature greater than 350° C., as shown in FIG. 1B. And then, the silicon nitride 8a, 8b is patterned by a photolithography process and a dry etching process, thereby forming the barrier rib 8 with an upright taper in a lower part and a reverse taper in an upper part, as shown in FIG. 1C.

Herein, the silicon nitride has a characteristic of being differently etched during the dry etching process in accordance with the deposit temperature. To describe this in detail, the silicon nitride deposited at the temperature of not greater than 280° C. is etched with an upright taper shape by the dry etching process, and the silicon nitride deposited at the temperature greater than 350° C. is etched in the reverse taper shape by the dry etching process. Accordingly, the barrier rib 8 of the organic EL display device of the related art deposits the silicon nitride at different temperatures, and thus, by use of the characteristic of the silicon nitride it is possible to form the barrier rib 8 having an upright taper shape in the lower part and the reverse taper shape in the upper part.

However, the fabricating method of the organic EL display device of the related art has a characteristic that the silicon nitride SiN×2 deposited at the temperature greater than 350° C. is etched to have a large reverse taper, as shown in FIG. 2, by the dry etching process. Due to this, the fabricating method of the organic EL display device of the related art produces a phenomenon where an area where the organic light emitting layer 10 can be formed is hidden by the big reverse taper and should form the barrier rib 8 with a height higher than a height by which the organic light emitting layer 10 is filled.

Accordingly, the fabricating method of the organic EL display device of the related art lowers the thickness of the silicon nitride deposited at the temperature greater than 350° C. in order to reduce the height of the barrier rib SiN×2 8b with the reverse taper shape, thereby reducing the phenomenon that the area where the organic light emitting layer 10 can be formed is hidden by the barrier rib 8b with the reverse taper shape. The fabricating method forms the barrier rib 8a with the upright taper by depositing the silicon nitride at the temperature of not greater than 280° C. in the lower part of the barrier rib 8b with the reverse taper, thereby forming the barrier rib 8 at the height by which the organic light emitting layer 10 can be filled.

Accordingly, the fabricating method of the organic EL display device of the related art deposits an inorganic material such as the silicon nitride at deposition temperatures that are different from each other, thus the barrier rib 8a with the upright taper shape is formed at the lower part and the barrier rib 8b with the reverse taper shape is formed at the upper part, thus there is a disadvantage that the number of processes for forming the barrier rib 8 with the reverse taper shape is increased because the barrier rib 8 is formed in double layer.

Also, according to the related art, if the silicon nitride deposited on a substrate in single layer, for example, at the temperature greater than 350° C., then patterned by a dry etching process to form a barrier rib, the barrier rib is formed in an upright taper by the characteristic of the dry etching process. So, according to the related art, a barrier rib with a reverse taper can not be achieved in single layer using a silicon nitride.

According to another related art, a barrier rib can be formed by depositing photosensitive organic material on a substrate and pattering it with a photolithography process. However, as the barrier rib formed by organic material is easily contaminated, therefore it decreases processing yield and causes a break in electrodes of an organic electro luminescence display frequently.

SUMMARY OF THE INVENTION

Accordingly, the present invention is directed to a fabricating method for an organic electro luminescence display device and organic electro luminescence display device using the same that substantially obviates one or more of the problems due to limitations and disadvantages of the related art.

An advantage of the present invention is to provide a fabricating method of an organic electro luminescence display device that simplifies a process by forming a barrier rib by use of a new material, and an organic electro luminescence display device using the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In order to achieve these and other advantages and in accordance with the purpose of the present invention, as embodied and broadly described, a fabricating method of an organic electro luminescence display device according to an aspect of the present invention includes: forming an anode electrode on an upper substrate; depositing ZnO on the entire surface of the upper substrate and forming a ZnO film by making the deposited ZnO grow crystals; forming a barrier rib with a reverse taper shape that divides an area where the organic light emitting layer is to be formed on the upper substrate by patterning the ZnO film; forming an organic light emitting layer in the cell area that is divided by the barrier rib; and forming a cathode electrode on the organic light emitting layer.

In another aspect of the present invention, an organic electro luminescence display device according to another aspect of the present invention includes an anode electrode on an upper substrate; a ZnO barrier rib with a reverse taper shape which divides a cell area where an organic light emitting layer is to be formed on the upper substrate; an organic light emitting layer in the cell area; and a cathode electrode on the organic light emitting layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 6 is a diagram representing a barrier rib with a reverse taper shape according to an embodiment of the present invention, in detail.

DETAILED DESCRIPTION OF THE PREFERRED EMBODIMENT

Reference will now be made in detail to the embodiments of the present invention, examples of which are illustrated in the accompanying drawings.

With reference to FIGS. 3 to 6, embodiments of the present invention will be explained as follows.

Figure 1A:
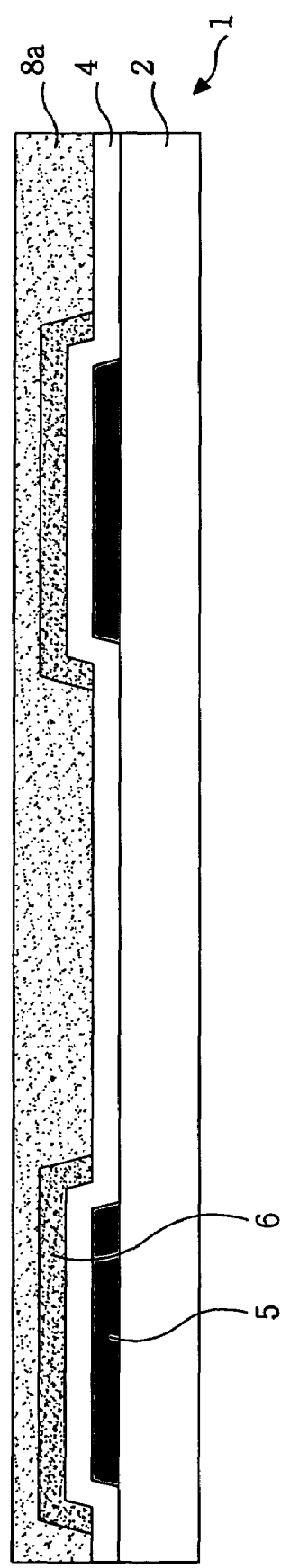
FIGS. 1A to 1C are diagrams representing a fabricating method of a barrier rib of an organic electro luminescence display device of the related art.
Figure 1B:
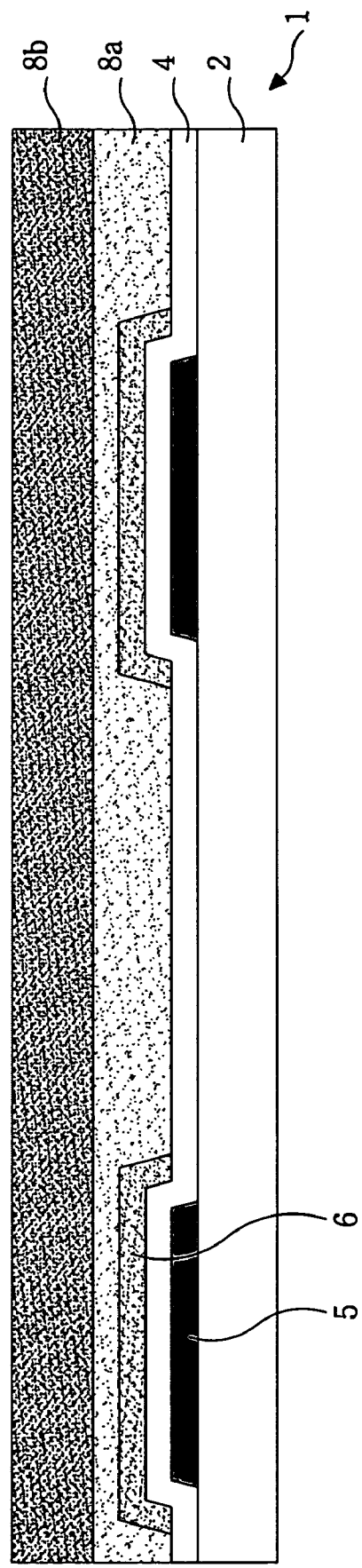
Figure 1C:
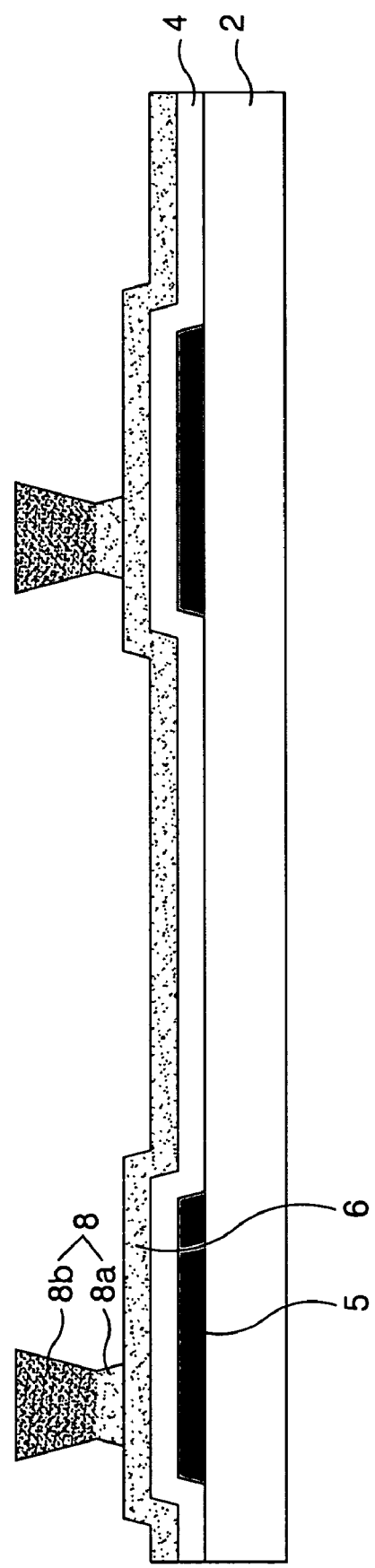
Figure 2:
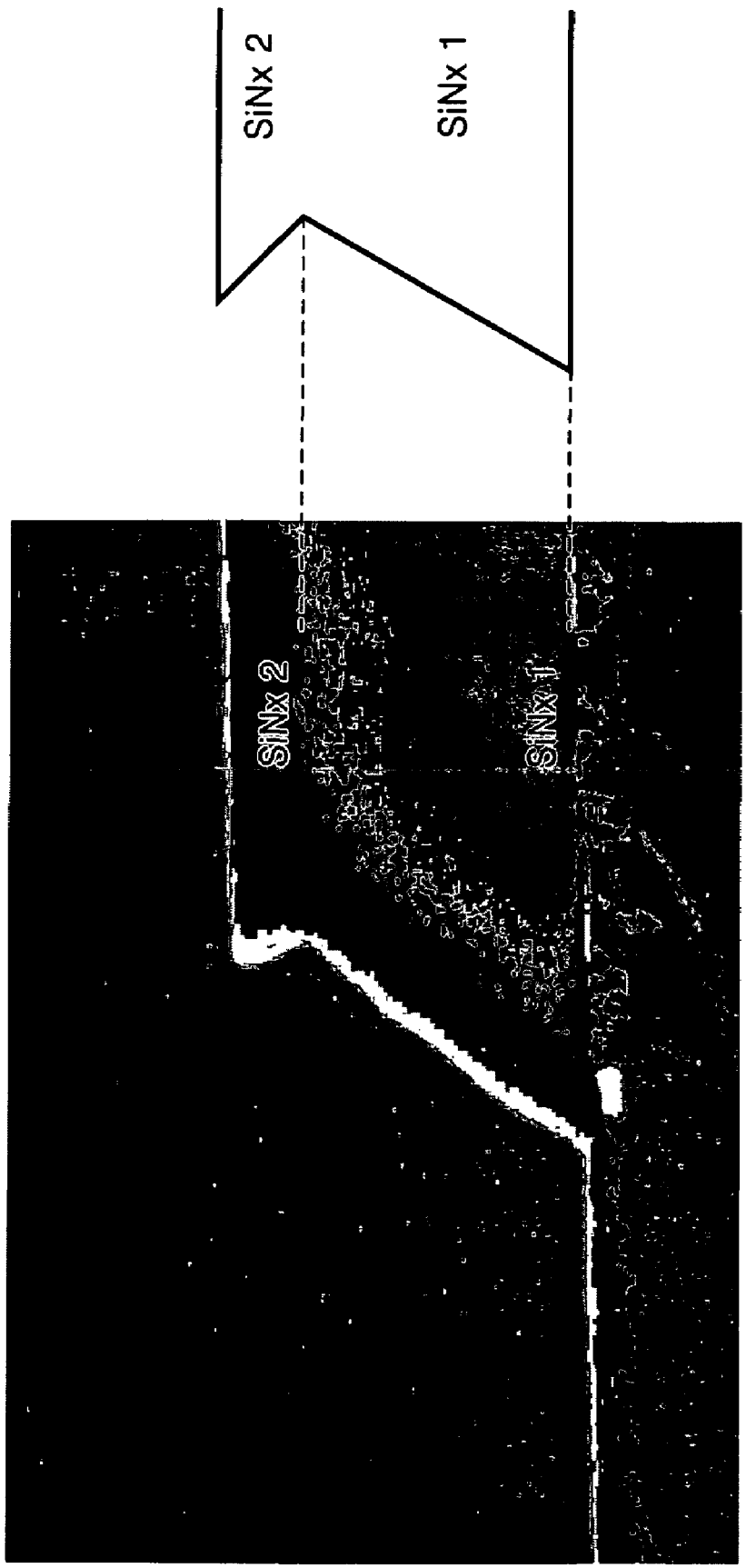
FIG. 2 is a diagram representing a barrier rib with a reverse taper shape of the related art in detail.
Figure 3:
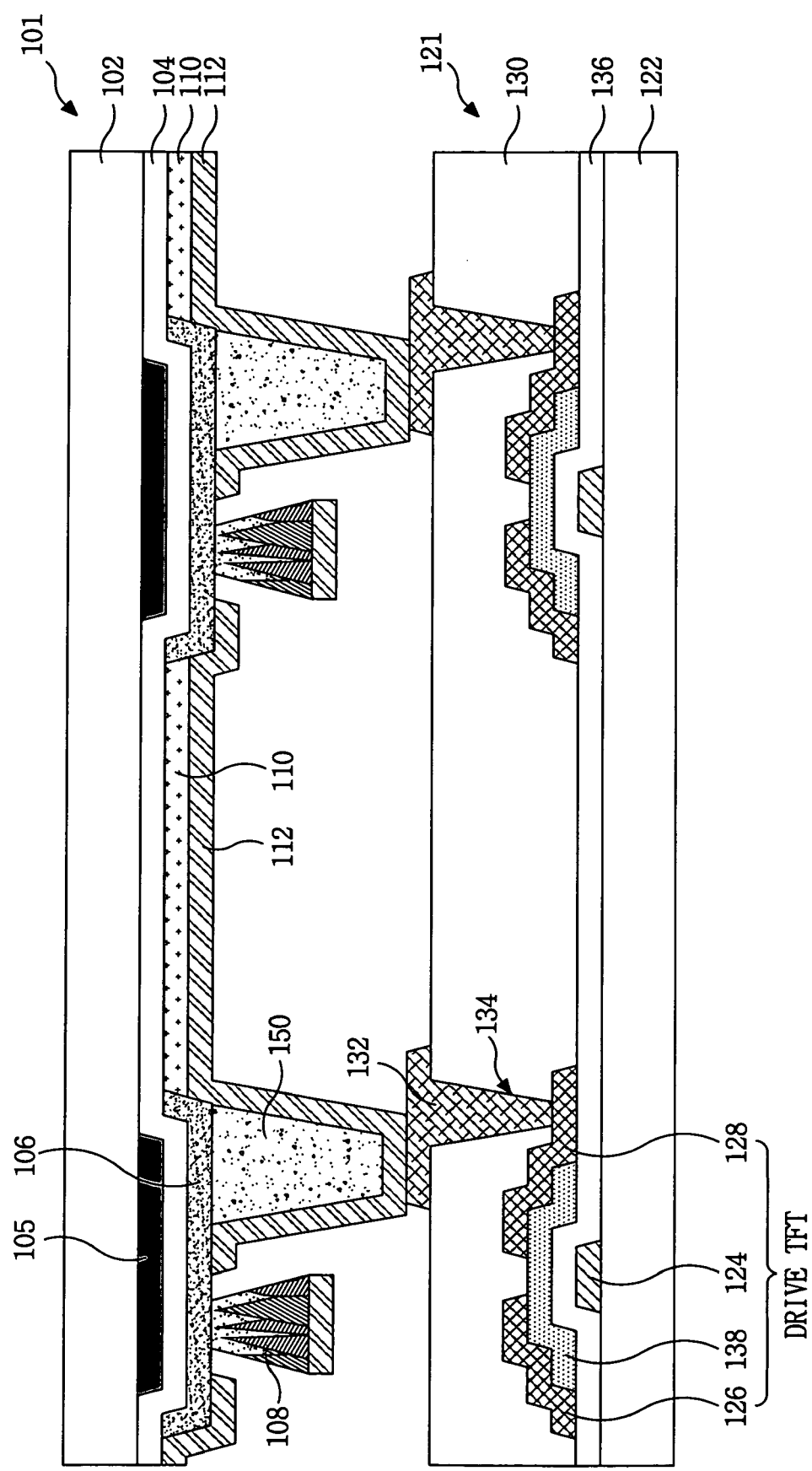
FIG. 3 is a cross sectional diagram representing an organic electro luminescence display device according to an embodiment of the present invention.

FIG. 3 is a cross sectional diagram representing an organic EL display device according to an embodiment of the present invention.

Referring to FIG. 3, an organic EL display device according to the embodiment of the present invention includes an upper array substrate 101 where an EL cell is formed; a lower array substrate 121 where a drive TFT T2 for driving the EL cell is formed; and a spacer 150 which connects a cathode electrode 112 of the EL cell to a drain electrode 128 of the drive TFT T2.

The upper array substrate 101 includes: an EL cell including of an anode electrode 104 and a cathode electrode 112 that have an organic light emitting layer 110 formed therebetween on an upper substrate 102 and are insulated by an insulating film 106; a barrier rib 108 for separating the EL cell; and a bus electrode 105 formed under the anode electrode 104 for compensating a high resistance of the anode electrode 104. The organic EL display device includes the spacer 150 for connecting the cathode electrode 112 of the upper array substrate 101 to the drain electrode 128 of the drive TFT T2 of the lower array substrate 121.

In the upper array substrate 101, the anode electrode 104 is formed by having a transparent conductive material such as ITO (indium tin oxide), etc deposited on the upper substrate 102. A drive signal for emitting holes from a voltage supply source (VDD) is supplied to the anode electrode 104.

A bus electrode 105 is formed to define an area where the organic light emitting layer 110 is to be formed and is connected to the anode electrode 104 to compensate for a high resistance of the anode electrode 104.

The cathode electrode 112 is formed at an EL cell area divided by the barrier rib 108. A drive signal for emitting electrons is supplied to the cathode electrode 112 through a drive TFT T2. At this moment, the cathode electrode 112 is formed to encompass the spacer 150 and is connected to a drain electrode 128 of the drive TFT T2 on the lower array substrate 121.

The barrier rib 108 is formed with a reverse taper shape by patterning ZnO by a wet etching process after depositing the ZnO on the upper substrate 102 at a high temperature. The barrier rib 108 is formed to expose an area where the organic light emitting layer 110 is to be formed so as to divide the EL cell area and is formed in a reverse taper shape, thereby separating the cathode electrode 112 without patterning when forming the cathode electrode 112.

The organic light emitting layer 110 is formed by having a hole injection layer, a hole transport layer, a light emitting layer, an electron transport layer and an electron injection layer deposited. In the organic light emitting layer 110, if the drive signal is supplied to the anode electrode 104 and the cathode electrode 112, the holes and electrons emitted from the anode electrode 104 and the cathode electrode 112 are re-combined within the light emitting layer, thereby generating a visible ray. At this moment, the generated visible ray exits the light emitting layer 110 through the transparent anode electrode 104 thus the organic EL display device displays a designated picture or image.

The spacer 150 is formed on the upper substrate 102 that overlaps the drain electrode 128 of the drive TFT T2 on the lower array substrate 121 to connect the drain electrode 128 of the drive TFT T2 of the lower array substrate 121 to the cathode electrode 112 of the EL cell.

The lower array substrate 121 includes a switch TFT (T1); and a drive TFT T2 of which a gate electrode 124 is connected to the drain electrode of the switch TFT.

In the lower array substrate 121, a gate electrode of the switch TFT is connected to the gate line and a source electrode is connected to the data line and the drain electrode is connected to the gate electrode 124 of the drive TFT T2.

The gate electrode 124 of the drive TFT T2 is formed on the lower substrate 122 together with the gate line, and the drive TFT T2 includes a semiconductor layer 138 overlapped with the gate electrode 124 of the drive TFT T2 with the gate insulating film 136; a source electrode 126 and a drain electrode 128 of the drive TFT T2 that are formed together with the data line, having the semiconductor layer 138 therebetween. The source electrode 126 of the drive TFT T2 is connected to a ground voltage source (GND) and the drain electrode 128 of the drive TFT T2 is connected to the cathode electrode of the upper array substrate 101. The drain electrode 128 of the drive TFT T2 is connected to the cathode electrode 112 of the upper array substrate 101 through a contact electrode 132 that is exposed on a passivation film 130 through a drain contact hole 134 which penetrates the passivation film 130.

Hereinafter, in reference to FIGS. 4A to 4F, a fabricating method of an organic EL display device according to an embodiment of the present invention will be explained in detail as follows.

Figure 4A:
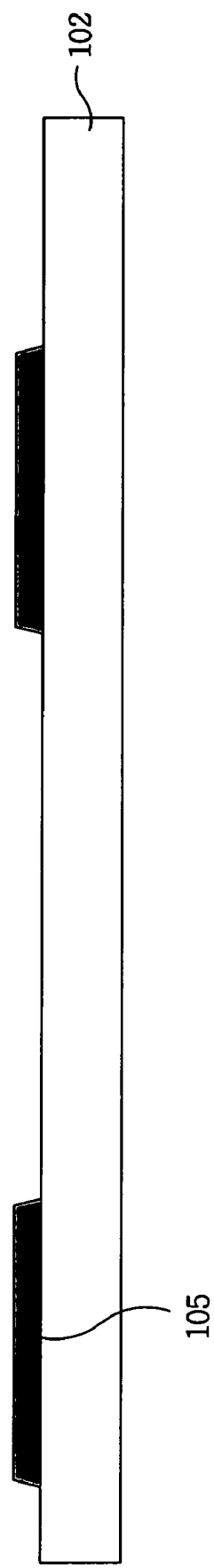
FIGS. 4A to 4F are cross sectional diagrams representing a fabricating method of an upper array substrate of an organic electro luminescence display device according to an embodiment of the present invention.

Referring to FIG. 4A, first, a bus electrode 105 is formed by patterning a metal material, for example molybdenum Mo or chrome Cr, after depositing the metal material on the upper substrate 102.

Figure 4B:
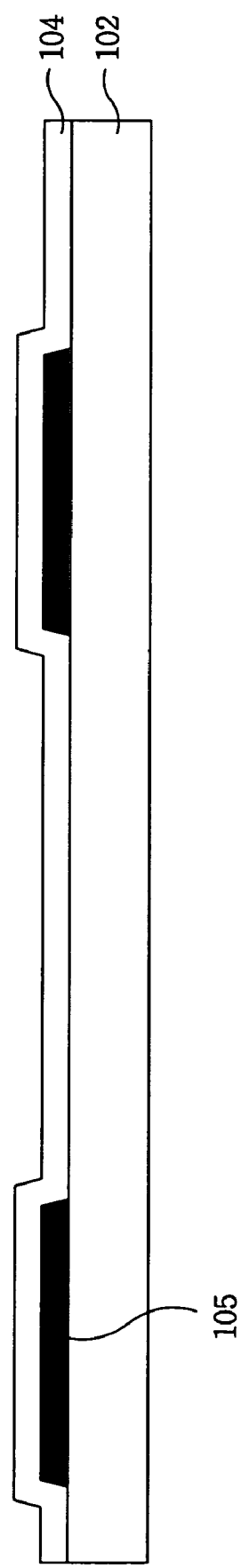

Subsequently, a transparent conductive material such as ITO, etc. is patterned after being deposited on the entire surface of the upper substrate 102, thereby forming the anode electrode 104, as shown in FIG. 4B.

Figure 4C:
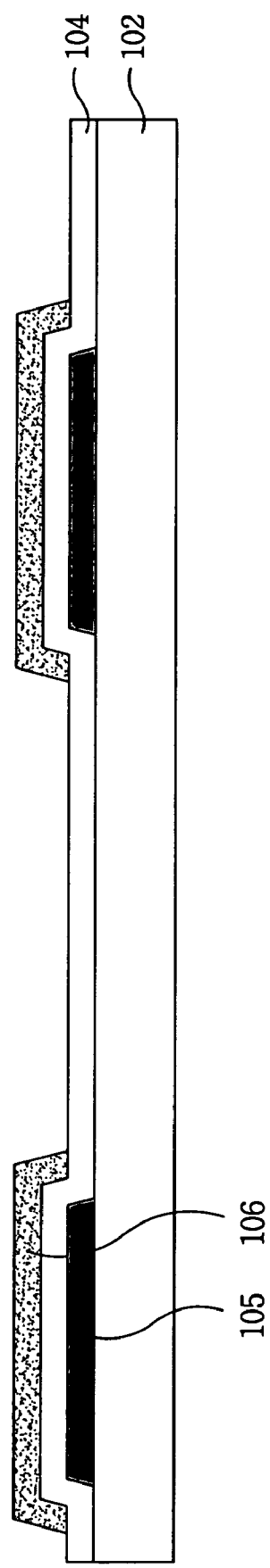

Then, an insulating material is patterned after being deposited on the entire surface of the upper substrate 102, thereby forming an insulating film 106 that exposes an area where the organic light emitting layer 110 is to be formed on the anode electrode 104, as shown in FIG. 4C.

Figure 4D:
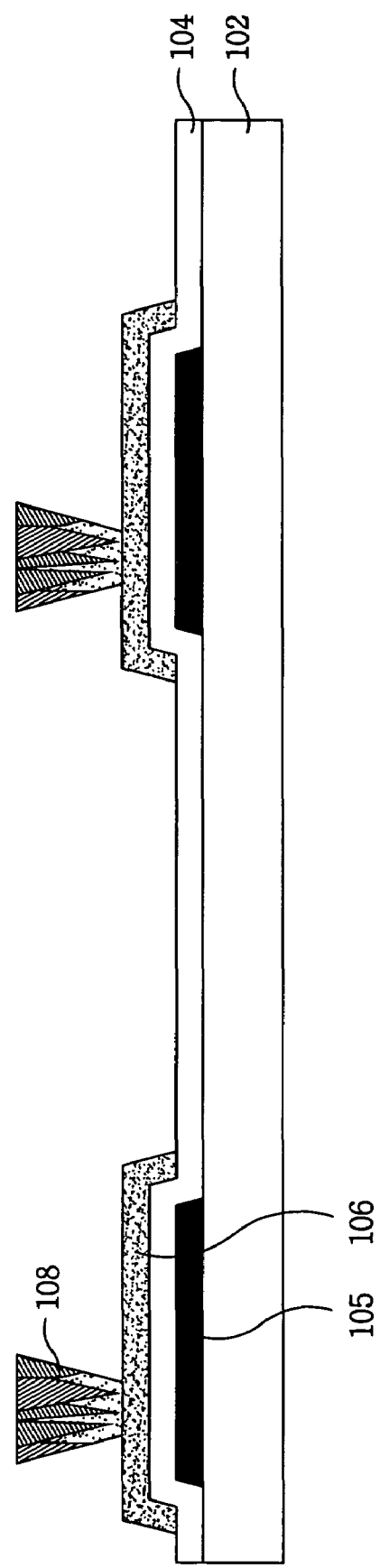

After this, ZnO is deposited on the entire surface of upper substrate 102 where the insulating film 106 is formed, at a high temperature greater than about 150° C., and then the ZnO is patterned by a wet etching process, thereby forming a barrier rib 108 with a reverse taper shape, as shown in FIG. 4D.

Herein, a fabricating method of an organic EL display device may form the barrier rib 108 in a reverse taper shape by use of a crystal growing characteristic of the ZnO film in accordance with the temperature at which the ZnO is deposited.

Figure 5:
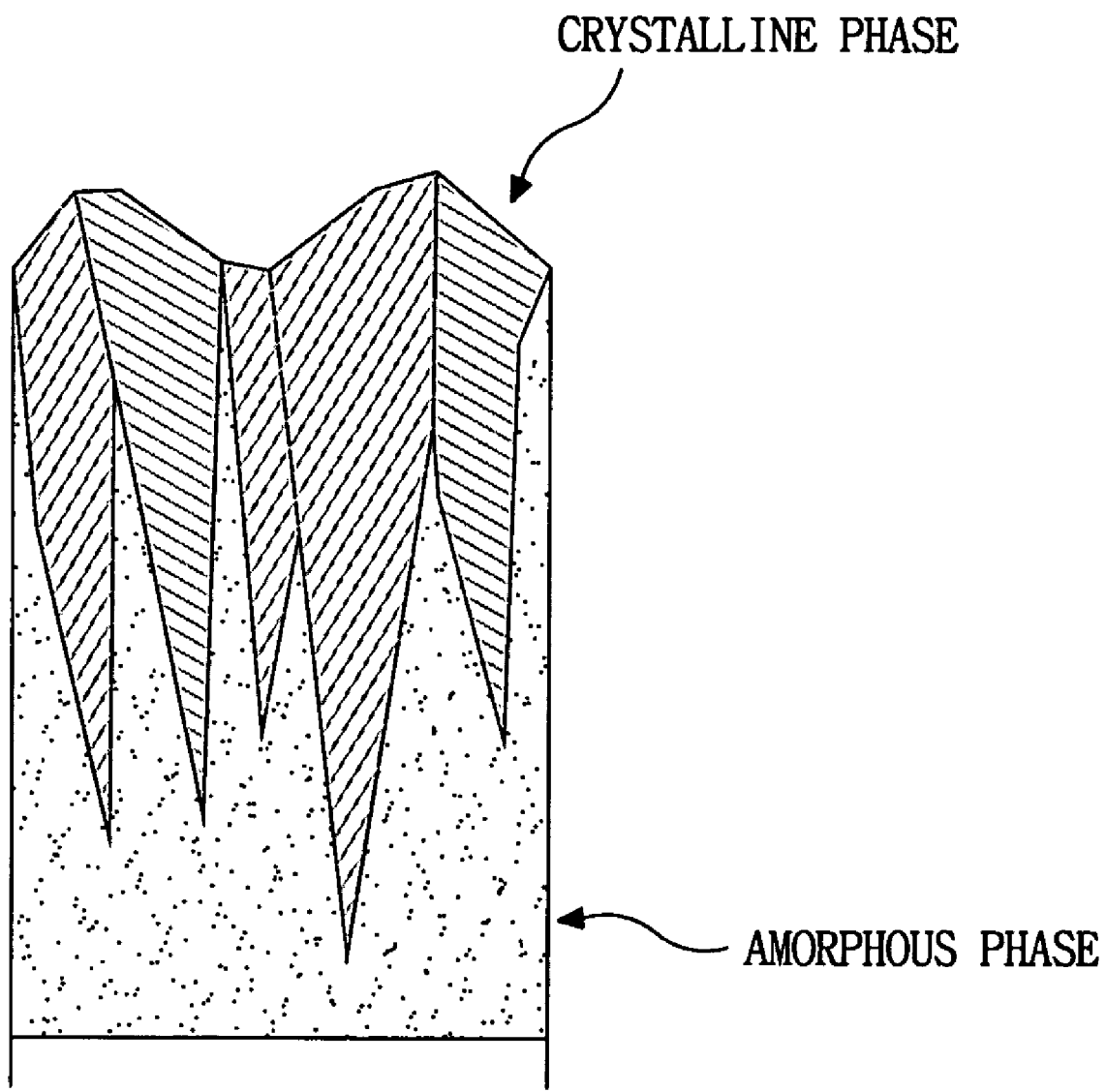
FIG. 5 is a diagram representing a crystal structure of ZnO that is deposited at a high temperature.

To describe this in detail, the ZnO film grows crystals in a shape as shown in FIG. 5 when deposited at a temperature greater than about 150° C. That is to say, the ZnO film deposited at the temperature of greater than about 150° C. is crystallized in a structure where the distribution of the crystalline ZnO film is high in the upper part, the crystalline ZnO film and an amorphous ZnO film are mixed in the middle part, and the distribution of the amorphous ZnO film is high in the lower part.

Accordingly, the fabricating method of the organic EL display device according to the present invention deposits the ZnO at a temperature greater than about 150° C., makes the ZnO grow, and then patterns the ZnO film by the wet etching process by use of a physical characteristic where the amorphous film is over-etched in the wet etching process in comparison to the crystalline film, thereby forming the barrier rib 108 with a reverse taper shape, as shown in FIG. 6.

As a depositing process, for example, Pulsed Laser Deposition PLD, RF sputtering, Chemical Vapor Deposition CVD, Plasma Enhanced Chemical Vapor Deposition PECVD, Metal Organic Chemical Vapor Deposition MOCVD, magnetron sputtering, Molecular Beam Epitaxy MBE or Ion Beam Sputtering can be used. By using such a depositing process, ZnO can be deposited at a temperature from a room temperature (about 20° C.) to about 600° C. Especially, if the ZnO is deposited at a temperature greater than about 150° C., the ZnO film can be formed well in a structure where the upper part is mainly composed of the crystalline ZnO film and the lower part is mainly composed of the amorphous ZnO film.

Figure 4E:
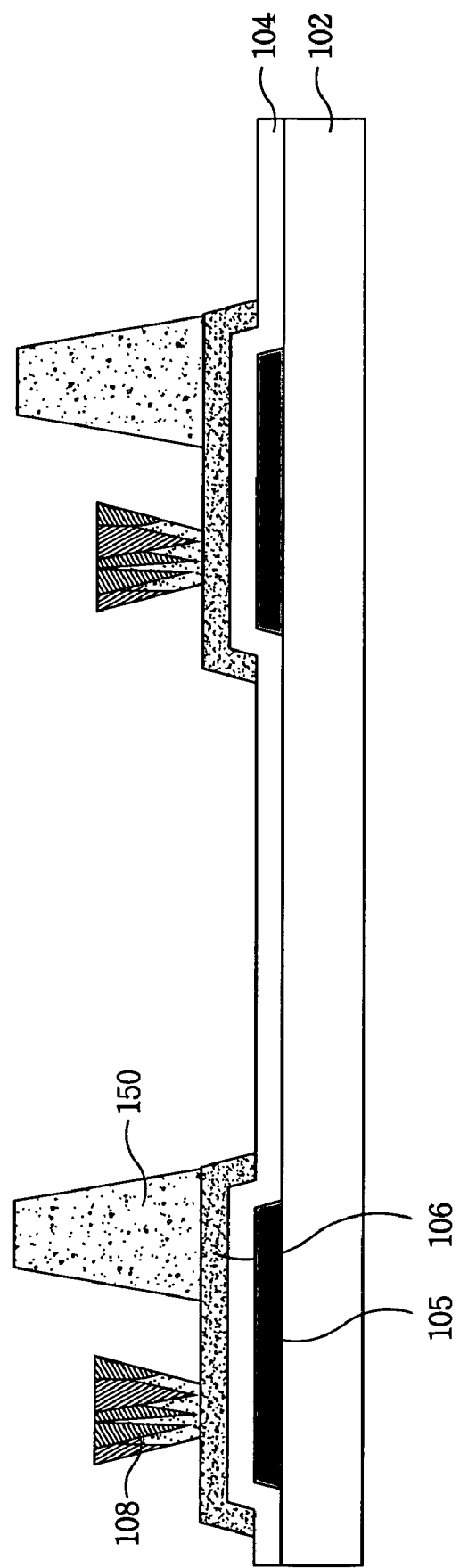

Subsequently, an insulating material is patterned after being spread over the entire surface of the upper substrate 102 where the barrier rib 108 with the reverse taper shape is formed, thereby forming the spacer 150 in an area which overlaps with the drain electrode 128 of the drive TFT of the lower array substrate 121, as shown in FIG. 4E.

Figure 4F:
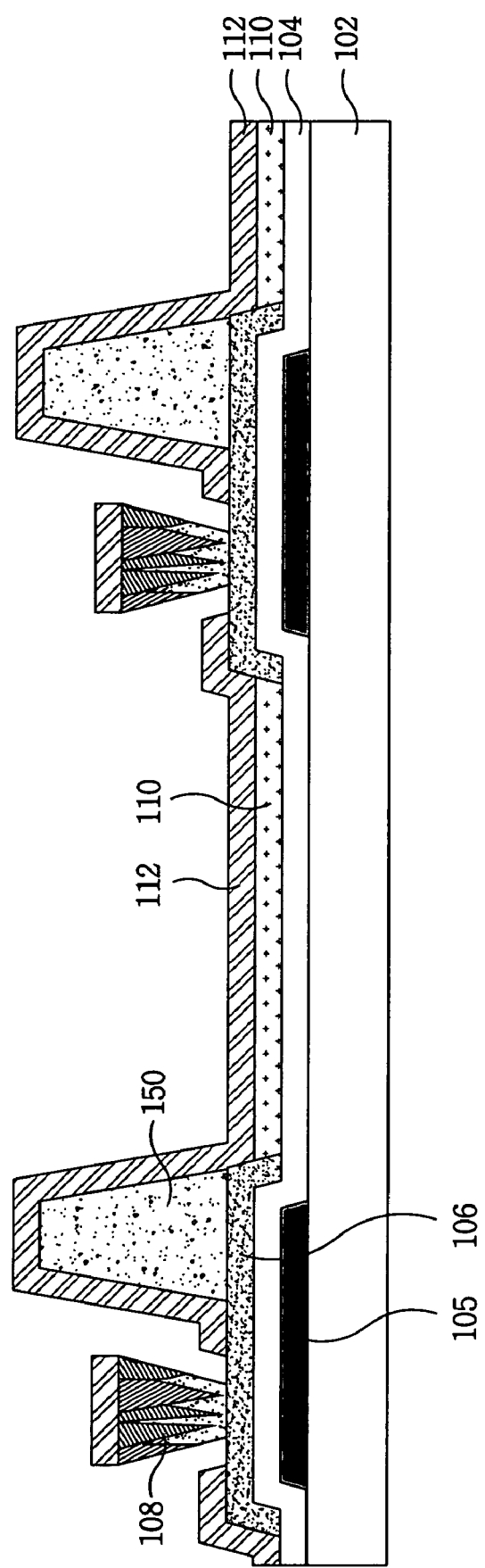

An organic light emitting material is next deposited in the EL cell area by use of a mask to form the organic light emitting layer 110, and then the cathode electrode 112 is formed in the EL cell area, as shown in FIG. 4F, by depositing an electrode material on the entire surface and by being separated by the barrier rib 108 with the reverse taper shape. Next, the cathode electrode 112 is formed to encompass the spacer 150 to be connected to the drain electrode 128 of the drive TFT of the lower array substrate 121 after bonding the upper array substrate 101 and the lower array substrate 121 together.

In this way, the fabricating method of the organic EL display device when depositing the ZnO at the temperature greater than about 150° C., patterns the ZnO film by use of the characteristic of the ZnO film that the distribution of the crystalline film is high in the upper part of the deposited ZnO film and the distribution of the amorphous film is high in the lower part and the physical characteristic that the amorphous film is over-etched during the wet etching process in comparison with the crystalline film, thereby forming the barrier rib 108 with the reverse taper shape. Accordingly, the fabricating method of the organic EL display device according to the present invention may reduce the number of processes by replacing the process where the silicon nitride is deposited at different temperatures in order to form the barrier rib with the reverse taper shape of the related art.

As described above, the fabricating method of the organic electro luminescence display device according to the embodiment of the present invention forms the barrier rib with the reverse taper shape by depositing the ZnO at the temperature greater than about 150° C. and etching the ZnO by a wet etching process. Accordingly, the fabricating method of the organic EL display device according to the present invention replaces the process of depositing the silicon nitride at different temperatures in order to form the barrier rib of the reverse taper shape of the related art, thereby being able to reduce the number of processes.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A fabricating method of an organic electro luminescence display device, comprising:
    forming an anode electrode on an upper substrate;
    depositing ZnO on the entire surface of the upper substrate and forming a ZnO film by making the deposited ZnO grow crystals;
    forming a barrier rib with a reverse taper shape by over-etching the ZnO film;
    depositing an insulation layer on the entire surface of the upper substrate on which the barrier rib is formed and forming a spacer separated from the barrier rib by patterning the insulation layer, wherein the barrier rib and the spacer divide an area of the upper substrate on which an organic light emitting layer is to be formed;
    forming an organic light emitting layer in the cell area that is divided by the barrier rib and the spacer; and
    forming a cathode electrode on the organic light emitting layer.

2. The fabricating method according to claim 1, wherein the ZnO is deposited and grows at a temperature greater-than about 150° C.

3. The fabricating method according to claim 1, wherein the ZnO film has a high distribution of an amorphous structure in a lower part and a high distribution of a crystalline structure in an upper part.

4. The fabricating method according to claim 1, wherein the ZnO film is patterned by a photolithography process and a wet etching process.

5. The fabricating method according to claim 1, further comprising:
    forming an insulating film that exposes an area where an organic light emitting layer is to be formed on the anode electrode;
    forming a thin film transistor array on a lower substrate that faces the upper substrate; and
    bonding the upper substrate to the lower substrate.

6. The fabricating method according to claim 1, wherein the step of forming the cathode electrode includes spreading an electrode material on the entire surface of the upper substrate where the barrier rib and the organic light emitting layer are formed.

7. The fabricating method according to claim 1, wherein forming the thin film transistor array includes forming a drive thin film transistor including a drain electrode connected to the cathode electrode and a switch thin film transistor including a drain electrode connected to a gate electrode of the drive transistor.

8. The fabricating method according to claim 7, wherein the spacer connects the cathode electrode to the drain electrode of the drive thin film transistor on the upper substrate.

9. The fabricating method according to claim 7, wherein the cathode electrode is formed to encompass the spacer and is connected to the drain electrode of the drive thin film transistor.

10. The fabricating method according to claim 1, further including forming a bus electrode that defines an area where the organic light emitting layer is to be formed on the upper substrate.

11. A fabricating method of an organic electro luminescence display device, comprising:
    forming an anode electrode on an upper substrate;
    forming an insulating film that exposes an area where an organic light emitting layer is to be formed on the anode electrode;
    depositing ZnO on the entire surface of the insulating film and forming a ZnO film by making the deposited ZnO grow crystals, wherein the ZnO is deposited and grows at a temperature greater-than about 150° C. and wherein the ZnO film has a high distribution of an amorphous structure in a lower part and a high distribution of a crystalline structure in an upper part;
    forming a barrier rib with a reverse taper shape by over-etching the ZnO film;
    depositing an insulation layer on the entire surface of the upper substrate on which the barrier rib is formed and forming a spacer separated from the barrier rib by patterning the insulation layer, wherein the barrier rib and the spacer divide an area of the upper substrate on which an organic light emitting layer is to be formed;
    forming an organic light emitting layer in the cell area that is divided by the barrier rib and the spacer;
    forming a cathode electrode on the organic light emitting layer;
    forming a thin film transistor array on a lower substrate that faces the upper substrate; and
    bonding the upper substrate to the lower substrate.

12. The fabricating method according to claim 11, wherein the ZnO film is patterned by a photolithography process and a wet etching process.

* * * * *